United States Patent
Anderson et al.

(10) Patent No.: US 11,556,542 B2
(45) Date of Patent: Jan. 17, 2023

(54) OPTIONALLY COMPRESSED OUTPUT FROM COMMAND-LINE INTERFACE

(71) Applicant: International Business Machines Corporation, Armonk, NY (US)

(72) Inventors: Dale H. Anderson, Tucson, AZ (US); Jason L. Peipelman, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 848 days.

(21) Appl. No.: 14/616,667

(22) Filed: Feb. 7, 2015

(65) Prior Publication Data
US 2016/0232209 A1 Aug. 11, 2016

(51) Int. Cl.
G06F 16/2455 (2019.01)
G06F 3/0482 (2013.01)
G06F 9/455 (2018.01)
H03M 7/30 (2006.01)

(52) U.S. Cl.
CPC ...... *G06F 16/24561* (2019.01); *G06F 3/0482* (2013.01); *G06F 9/45512* (2013.01); *H03M 7/702* (2013.01)

(58) Field of Classification Search
None
See application file for complete search history.

(56) References Cited

U.S. PATENT DOCUMENTS

| | | | | |
|---|---|---|---|---|
| 6,003,024 | A * | 12/1999 | Bair | G06F 17/30551 |
| 7,023,579 | B2 * | 4/2006 | Toda | G06K 15/02 358/1.11 |
| 9,722,879 | B1 * | 8/2017 | Muthu | H04L 67/1097 |
| 2004/0044685 | A1 * | 3/2004 | Huynh | G06F 17/30592 |
| 2005/0102156 | A1 * | 5/2005 | Linduff | G06Q 10/1057 705/322 |
| 2006/0218503 | A1 * | 9/2006 | Matthews | G06F 9/4443 715/779 |
| 2008/0080389 | A1 * | 4/2008 | Hart | H04L 41/12 370/252 |
| 2008/0147627 | A1 | 6/2008 | Natkovich et al. | |
| 2008/0183656 | A1 * | 7/2008 | Perng | G06F 17/30286 |

(Continued)

OTHER PUBLICATIONS

IBM, "Employee name auto complete with command line interpreter for resolving other ids in large organisations," available at ip.com, No. IPCOM000182315D, Apr. 27, 2009.

*Primary Examiner* — Wilson Lee
(74) *Attorney, Agent, or Firm* — Nelson IP; Daniel P. Nelson

(57) ABSTRACT

A method for presenting output returned by a command-line interface is disclosed. In one embodiment, such a method submits, by way of a command-line interface (CLI), a command to retrieve a list of resources. The method further submits, in association with the command, an indicator to compress the list. In response to receiving the command and indicator, the method retrieves the list of resources and compresses the list such that resources with identical attributes are presented as a single tuple in the list. Such a tuple may, in certain embodiments, identify the resources with identical attributes as a range of resources and/or as a comma delimited list of resources. The tuple may also, in certain embodiments, identify how many resources with identical attributes are represented by the tuple. A corresponding system and computer program product are also disclosed.

18 Claims, 6 Drawing Sheets

(56) References Cited

U.S. PATENT DOCUMENTS

| | | | |
|---|---|---|---|
| 2008/0227063 A1* | 9/2008 | Kenedy | G06Q 40/00 434/219 |
| 2009/0171999 A1* | 7/2009 | McColl | G06F 17/30539 |
| 2012/0054225 A1 | 3/2012 | Marwah et al. | |
| 2013/0103817 A1* | 4/2013 | Koponen | G06F 9/45558 709/223 |
| 2013/0151491 A1* | 6/2013 | Gislason | G06F 17/30563 707/696 |
| 2013/0185752 A1* | 7/2013 | Itagaki | H04N 21/472 725/39 |
| 2013/0198605 A1* | 8/2013 | Nicola | G06F 17/2247 715/234 |
| 2014/0052685 A1* | 2/2014 | Adair | G06N 5/02 706/48 |
| 2014/0208388 A1* | 7/2014 | Wong | H04L 63/08 726/4 |
| 2014/0218609 A1* | 8/2014 | Huang | G06K 9/00765 348/445 |
| 2014/0304279 A1* | 10/2014 | Fuchs | G06F 16/2465 707/750 |
| 2014/0306833 A1* | 10/2014 | Ricci | B60Q 1/00 340/901 |
| 2014/0325473 A1* | 10/2014 | Tu | G06F 8/34 717/106 |
| 2014/0349691 A1* | 11/2014 | Kumar | H03M 7/3059 455/466 |
| 2015/0088925 A1* | 3/2015 | Pattabhiraman | G06F 16/2282 707/769 |
| 2015/0095467 A1* | 4/2015 | Kuc | H04L 41/0803 709/220 |
| 2015/0103672 A1* | 4/2015 | Stuart | H04L 45/38 370/241 |
| 2015/0169330 A1* | 6/2015 | Maity | G06F 9/4401 713/1 |
| 2015/0324300 A1* | 11/2015 | Sampathkumar | G06F 12/0871 711/136 |
| 2015/0350299 A1* | 12/2015 | Pineas | H04L 67/06 709/203 |
| 2016/0063282 A1* | 3/2016 | Shani | G06F 8/60 717/121 |

\* cited by examiner

```
dscli> lsarray -l
```

| Name | State | StgType | Pool | RAID | DriveClass | DriveCap | DriveRPM | DAPair |
|------|-------|---------|------|------|------------|----------|----------|--------|
| MA1 | Normal | CKD | zSeries_1 | RAID6 | ENT | 600.0 | 10k | 0 |
| MA2 | Normal | CKD | zSeries_1 | RAID6 | ENT | 600.0 | 10k | 0 |
| MA3 | Normal | CKD | zSeries_1 | RAID6 | ENT | 600.0 | 10k | 0 |
| MA4 | Normal | CKD | zSeries_1 | RAID6 | ENT | 600.0 | 10k | 0 |
| MA5 | Normal | CKD | zSeries_1 | RAID6 | ENT | 600.0 | 10k | 0 |
| MA6 | Normal | CKD | zSeries_1 | RAID6 | ENT | 600.0 | 10k | 0 |
| MA7 | Normal | FB | myPool | RAID5 | NL | 600.0 | 7.2k | 1 |
| MA8 | Normal | FB | myPool | RAID5 | NL | 600.0 | 7.2k | 1 |
| MA9 | Normal | FB | myPool | RAID5 | NL | 600.0 | 7.2k | 1 |
| MA10 | Normal | FB | myPool | RAID5 | SSD | 600.0 | - | 2 |
| MA11 | Normal | CKD | zSeries_1 | RAID6 | ENT | 600.0 | 10k | 3 |
| MA12 | Normal | CKD | zSeries_1 | RAID6 | ENT | 600.0 | 10k | 3 |
| MA13 | Normal | CKD | zSeries_1 | RAID6 | ENT | 600.0 | 10k | 3 |
| MA14 | Normal | CKD | zSeries_1 | RAID6 | ENT | 600.0 | 10k | 3 |
| MA15 | Normal | CKD | zSeries_1 | RAID6 | ENT | 600.0 | 10k | 3 |
| MA16 | Normal | CKD | zSeries_1 | RAID6 | ENT | 600.0 | 10k | 3 |
| MA17 | Normal | FB | myPool | RAID5 | NL | 600.0 | 7.2k | 4 |
| MA18 | Normal | FB | myPool | RAID5 | NL | 600.0 | 7.2k | 4 |
| MA19 | Normal | FB | myPool | RAID5 | NL | 600.0 | 7.2k | 4 |
| MA20 | Normal | FB | myPool | RAID5 | SSD | 600.0 | - | 5 |

Fig. 2

```
dscli> lsarray -l -compress
  #   Names      State   StgType  Pool       RAID   DriveClass  DriveCap  DriveRPM  DAPair
 === ========== ======= ======== ========== ====== =========== ========= ========= =======
  6   MA1-MA6    Normal  CKD      zSeries 1  RAID6  ENT         600.0     10k       0
  3   MA7-MA9    Normal  FB       myPool     RAID5  NL          600.0     7.2k      1
  1   MA10       Normal  FB       myPool     RAID5  SSD         600.0     -         2
  6   MA11-MA16  Normal  CKD      zSeries 1  RAID6  ENT         600.0     10k       3
  3   MA17-MA19  Normal  FB       myPool     RAID5  NL          600.0     7.2k      4
  1   MA20       Normal  FB       myPool     RAID5  SSD         600.0     -         5
```

Fig. 3

```
dscli> lsarray -l -compress
 #   Names                State   StgType  Pool        RAID   DriveClass  DriveCap  DriveRPM  DAPair
====================================================================================================
12   MA1-MA6, MA11-MA16   Normal  CKD      zSeries 1   RAID6  ENT         600.0     10k       0
 6   MA7-MA9, MA17-MA19   Normal  FB       myPool      RAID5  NL          600.0     7.2k      1
 2   MA10, MA20           Normal  FB       myPool      RAID5  SSD         600.0     -         2
```

Fig. 4

OPTIONALLY COMPRESSED OUTPUT FROM COMMAND-LINE INTERFACE

BACKGROUND

Field of the Invention

This invention relates to systems and methods for presenting output returned by a command-line interface.

Background of the Invention

A command-line interface (CLI), also known as a command-line user interface, console user interface, character user interface, or the like, is a commonly-used computer program to interact with other programs or operating systems. A CLI enables a user or client to enter commands to a program or operating system in the form of successive lines of text (i.e., command lines), and then executes the command lines to provide a textual display of results or error messages. Although less user-friendly than many modern graphical user interfaces (GUIs), command-line interfaces are frequently used by more sophisticated computer users, programmers, or system administrators, as they often provide a more concise and powerful way to interact with a program or operating system.

Unfortunately, like the textual input, the textual output from many CLIs is not user-friendly and may be presented in a hard-to-read or archaic format. In some cases the output may include long lists of redundant or identical information. Sorting through this information can be time-consuming and frustrating for a user. In other cases, long lists of data may be output from a CLI in a way that the data scrolls off the user's screen before the user has a chance to examine the data.

In view of the foregoing, what are needed are systems and methods to present output of a command-line interface in a more user-consumable format. Ideally, such systems and methods would enable a user to quickly examine and analyze large amounts of information output from a CLI. Further needed are systems and method to present large amounts of information from a CLI in a relatively small area.

SUMMARY

The invention has been developed in response to the present state of the art and, in particular, in response to the problems and needs in the art that have not yet been fully solved by currently available systems, methods, and computer program products. Accordingly, systems, methods, and computer program products are disclosed to more efficiently present output returned by a command-line interface. The features and advantages of the invention will become more fully apparent from the following description and appended claims, or may be learned by practice of the invention as set forth hereinafter.

Consistent with the foregoing, a method for presenting output returned by a command-line interface is disclosed. In one embodiment, such a method submits, by way of a command-line interface (CLI), a command to retrieve a list of resources. The method further submits, in association with the command, an indicator to compress the list. In response to receiving the command and indicator, the method retrieves the list of resources and compresses the list such that resources with identical attributes are presented as a single tuple in the list. Such a tuple may, in certain embodiments, identify the resources with identical attributes as a range of resources and/or as a comma delimited list of resources. The tuple may also, in certain embodiments, identify how many resources with identical attributes are represented by the tuple.

A corresponding system and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 2 shows one example of a list of resources that is returned by a command-line interface;

FIG. 3 shows one example of a compressed list of resources returned by a command-line interface in accordance with the invention;

FIG. 4 shows another example of a compressed list of resources returned by a command-line interface in accordance with the invention;

DETAILED DESCRIPTION

Figure 1:
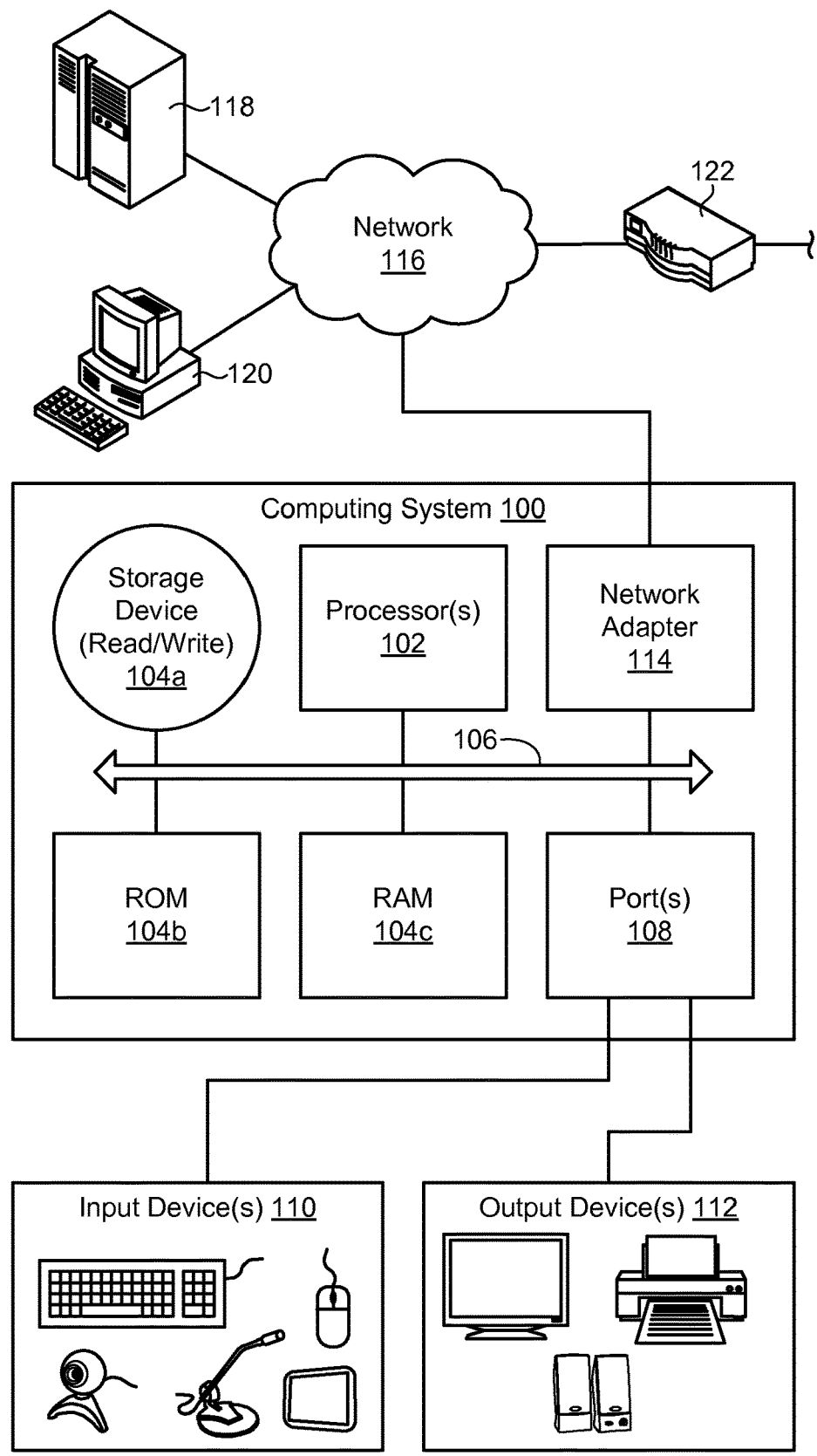
FIG. 1 is a high-level block diagram showing one example of a computing system in which a system and method in accordance with the invention may be implemented.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The present invention may be embodied as a system, method, and/or computer program product. The computer program product may include a computer readable storage medium (or media) having computer readable program instructions thereon for causing a processor to carry out aspects of the present invention.

The computer readable storage medium may be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on a user's computer, partly on a user's computer, as a stand-alone software package, partly on a user's computer and partly on a remote computer, or entirely on a remote computer or server. In the latter scenario, a remote computer may be connected to a user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Referring to FIG. 1, one example of a computing system 100 is illustrated. The computing system 100 is presented to show one example of an environment where a system and method in accordance with the invention may be implemented. The computing system 100 is presented only by way of example and is not intended to be limiting. Indeed, the systems and methods disclosed herein may be applicable to a wide variety of different computing systems in addition to the computing system 100 shown. The systems and methods disclosed herein may also potentially be distributed across multiple computing systems 100.

As shown, the computing system 100 includes at least one processor 102 and may include more than one processor 102. The processor 102 may be operably connected to a memory 104. The memory 104 may include one or more non-volatile storage devices such as hard drives 104*a*, solid state drives 104*a*, CD-ROM drives 104*a*, DVD-ROM drives 104*a*, tape drives 104*a*, or the like. The memory 104 may also include non-volatile memory such as a read-only memory 104*b* (e.g., ROM, EPROM, EEPROM, and/or Flash ROM) or volatile memory such as a random access memory 104*c* (RAM or operational memory). A bus 106, or plurality of buses 106, may interconnect the processor 102, memory devices 104, and other devices to enable data and/or instructions to pass therebetween.

To enable communication with external systems or devices, the computing system 100 may include one or more ports 108. Such ports 108 may be embodied as wired ports 108 (e.g., USB ports, serial ports, Firewire ports, SCSI ports, parallel ports, etc.) or wireless ports 108 (e.g., Bluetooth, IrDA, etc.). The ports 108 may enable communication with one or more input devices 110 (e.g., keyboards, mice, touchscreens, cameras, microphones, scanners, storage devices, etc.) and output devices 112 (e.g., displays, monitors, speakers, printers, storage devices, etc.). The ports 108 may also enable communication with other computing systems 100.

In certain embodiments, the computing system 100 includes a network adapter 114 to connect the computing system 100 to a network 116, such as a LAN, WAN, or the Internet. Such a network 116 may enable the computing system 100 to connect to one or more servers 118, workstations 120, personal computers 120, mobile computing devices, or other devices. The network 116 may also enable the computing system 100 to connect to another network by way of a router 122 or other device 122. Such a router 122 may allow the computing system 100 to communicate with servers, workstations, personal computers, or other devices located on different networks.

Referring to FIG. 2, as previously mentioned, a command-line interface (CLI) is a program commonly used to interact with other programs and operating systems. The CLI may enable a user or client to enter commands in the form of successive lines of text (i.e., command lines), and then execute the command lines to provide a textual display of results or error messages. In many CLIs, query commands may be used to retrieve a list of resources (e.g., hardware resources, software resources, or the like), with one resource displayed per row and attributes of the resource displayed in columns. Some of the attributes identify the resource while others indicate a current state of the resource. Depending on the query command involved, a very long list of resources may be displayed. In some cases, hundreds or even thousands of resources may be returned in the list. In many cases, such lists may include many resources that have identical or substantially identical attributes and only differ in terms of their identifiers (e.g., names).

FIG. 2 shows one example of a list of resources that is returned using the "lsarray" query command 200 of the IBM DS8000® enterprise storage system CLI (also referred to as "DSCLI"). Although the CLI of the IBM DS8000® enterprise storage system is discussed in the following example, it should be recognized that the systems and methods disclosed herein may be applicable to a wide variety of different CLIs and not just the IBM DS8000® enterprise storage system CLI. Thus, the IBM DS8000® enterprise storage system CLI is presented only by way of example and not limitation.

As shown in FIG. 2, the query command 200 returns a list 202 of resources, where each resource is represented by a row (or tuple) in the list 202. In IBM DS8000® enterprise storage system environments, resources may include arrays, pools, volumes, logical subsystems (LSSs), FlashCopy relationships, mirroring relationships, hosts, host ports, processor nodes, storage enclosures, drives, uninterruptible power supplies, hardware management consoles, I/O enclosures, host adapters, device adapters, I/O ports, and the like. In other environments, other types of resources would be possible and within the scope of the invention.

In the illustrated example, each resource is identified by a name and one or more attributes (i.e., State, StgType, Pool, RAID, DriveClass, DriveCap, DriveRpm, DAPair, etc.), as indicated at the top of each column. The "name" attribute serves to identify a particular resource while the other attributes serve to either identify or indicate a current state of the corresponding resource. In the illustrated example, the list 202 includes twenty resources named MA1, MA2, MA3 ... MA20. As shown in the example, various resources in the list have identical attribute values (in this example, the "DAPair" attribute is not considered since it is not an identifier). In particular, MA1-MA6 and MA11-MA16 have identical attribute values, MA7-MA9 and MA17-MA19 have identical attribute values, and MA10 and MA20 have identical attribute values. The list 202 is presented to show the utility of the claimed invention and is not intended to be limiting. In real-world implementations, such a list 202 may include hundreds or even thousands of rows.

In order to reduce the size of the list 202 and make the list 202 more fit for user consumption, while still providing the same or similar information, systems and methods in accordance with the invention may enable a user to optionally request a more compact version of the list 202. For example, systems and methods in accordance with the invention may enable a user to set or designate a compress indicator 204 when performing a query of resources. In certain embodiments, such a compress indicator 204 may take the form of a flag 204 or tag 204 added to a query command 200 in the command line of the CLI. In certain embodiments, the compress indicator 204 may be submitted to the CLI with the query command 200. The syntax or semantics of the compress indicator 204 may vary in different embodiments. In the illustrated embodiment, the compress indicator 204 is asserted by adding the phrase "—compress" after the query command 200 in the CLI's command line. One of skill in the art will recognize that the compress indicator 204 may take on many different forms and thus the illustrated example is not intended to be limiting.

Alternatively, the compress indicator 204 may be submitted to the CLI before or after the query command 200 is submitted. For example, the compress indicator 204 may be submitted to the CLI to indicate that the CLI should compress output associated with the next query command 200 received by the CLI. Alternatively, a compress indicator 204 may be submitted after the query command 200 to instruct the CLI to compress output associated with the previous query command 200. In other embodiments, a compress indicator 204 may be submitted to the CLI that makes data compression the default when returning data in response to query commands 200. Another indicator or command may, in certain embodiments, be used to undo the compress indicator 204 and thereby cause the CLI to return data in an uncompressed format.

FIG. 3 shows one example of the list 202 after it has been compressed using the aforementioned compress indicator 204. In this example, the compress indicator 204 causes the CLI to compress rows (tuples) that have identical attributes and appear in the list contiguously into a single tuple. Thus, in the illustrated example, resources MA1-MA6 (which have identical attributes and appear contiguously in the uncompressed list 202 in FIG. 2) are represented as a single tuple 300a, resources MA7-M9 (which have identical attributes and appear contiguously in the uncompressed list 202 in FIG. 2) are represented as a single tuple 300b, and so forth. The resources MA1-MA6 and MA7-MA are each expressed as a range of resources. In the illustrated embodiment, an extra column 302 is added to the list 202 that includes a count for each tuple, where the count indicates a number of resources that are represented by the tuple. Thus, the tuple 300a includes the number "6" and the tuple 300b includes the number "3" to indicate the number of resources that are represented by each tuple 300a, 300b respectively. The count column 302 is optional and may be omitted in certain embodiments.

FIG. 4 shows another embodiment of the list 202 after it has been compressed using the aforementioned compress indicator 204. In this example, rows (tuples) with identical attributes are combined into a single tuple regardless of where they appear in the list 202. For example, the resources MA1-MA6 and MA11-MA16 are combined into a single tuple even though all rows are not contiguous in the list 202, as are resources MA7-MA9 and MA17-MA19 and resources MA10 and MA20. As shown, the resources may be represented as a range and/or a comma-delimited list of resources. This embodiment has the advantage of providing greater compression (and possibly greater clarity) while having the disadvantage of potentially having to list larger numbers of resource IDs in the "names" column.

In certain embodiments, a CLI may consider all attributes (except for resource ID or name) when determining which resources have identical attributes. In other embodiments, the CLI may consider some subset of a set of attributes when determining which resources have identical attributes. That is, resources may be considered to have identical attributes if all of the attributes included in the subset have the same values, while ignoring whether other attribute values are identical. This subset may be fixed or user-selectable in different embodiments. In certain embodiments, the CLI may be configured to enable a user to include attributes in the subset that are considered important while excluding those that are considered less important.

Figure 5:
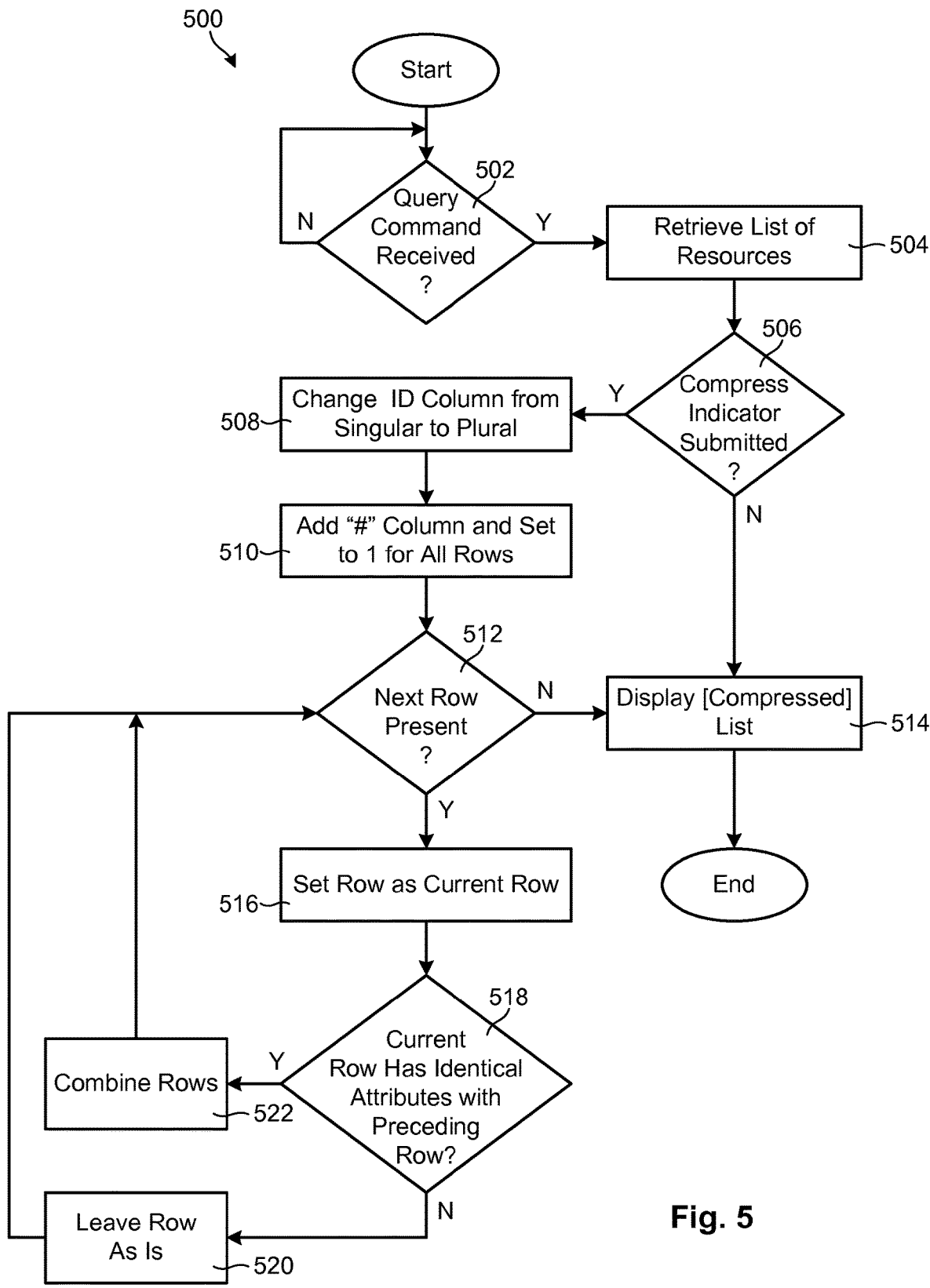
FIG. 5 shows one embodiment of a method for compressing a list of resources.

Referring to FIG. 5, one embodiment of a method 500 for compressing a list 202 of resources is illustrated. Such a method 500 may, in certain embodiments, be executed by a CLI, as previously discussed. As shown, the method 500 initially determines 502 whether a query command 200 has been received. When a query command 200 is received, the method 500 retrieves 504 a list of resources in the conventional manner. This list 202 may be the uncompressed list 202 of resources that would be retrieved absent any compress indicator 204.

The method 500 then determines 506 whether a compress indicator 204 has been submitted in association with the query command 200. If a compress indicator 204 has not been submitted, the method 500 displays an uncompressed version of the list 202. If, on the other hand, the compress indicator 204 has been submitted, the method 500 compresses the list 202. As shown, compressing the list 202 may include changing 508 the ID column of the list 202 from singular to plural (e.g., from "name" to "names") to indicate that a tuple may represent multiple resources. In certain embodiments, the method 500 may add 510 a column to the list 202 that indicates how many resources are represented by each tuple. This column may be initialized to "1" for all rows (i.e., tuples) in the list 202.

At this point, the illustrated method 500 determines 512 whether a next row is present in the list 202. If a next row is not present, the method 500 displays 514 the compressed list 202, which in this case may be an empty list 202, and ends. If a next row is present in the list 202, the method 500 sets 516 the row as the current row and determines 518 whether the current row has identical attributes with a preceding row (the "preceding row" may be a row immediately above the current row, or any row above the current row, depending on the embodiment involved). If the row has identical attributes with the preceding row, the method 500 combines 522 the current row with the preceding row. If the row does not have identical attributes with the preceding row, the row may be left 520 as is (i.e., left in its current position in the list 202). How a current row is combined with a preceding row will be discussed in association with FIG. 6.

The method 512 then determines 512 if a next row is present in the list 202. If a next row is present, the method 500 proceeds through the steps 516, 518, 520, 522 as previously discussed. If a next row is not present (i.e., the last row in the list 202 has already been processed), the list 202 is fully compressed and the method 500 displays 514 the compressed list and ends.

Figure 6:
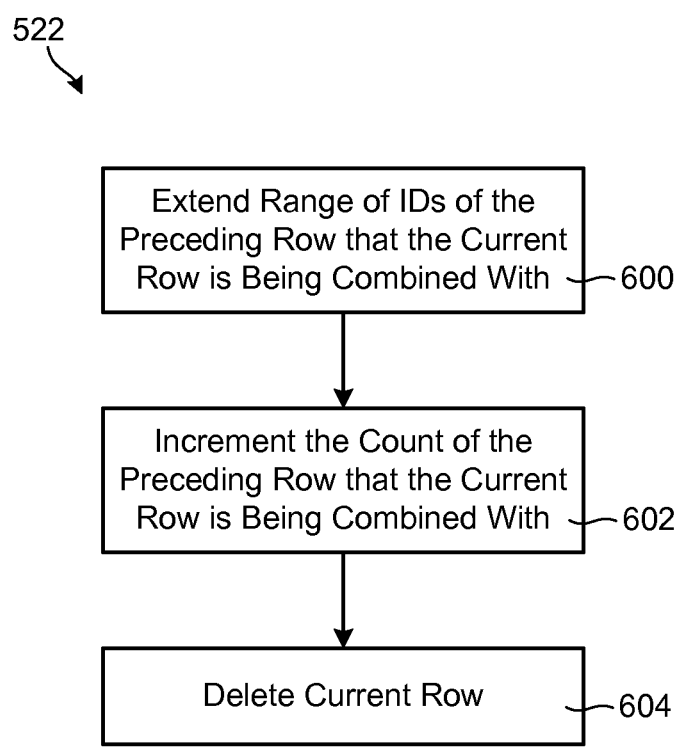
FIG. 6 shows one embodiment of a method for combining rows to generate a compressed list of resources.

Referring to FIG. 6, one embodiment of a method 522 for combining rows is illustrated. As shown, when combining a current row with a preceding row, the method 522 extends 600 the range of IDs of the preceding row (i.e., tuple) that the current row is being combined with. This may include, for example, including the resource ID of the current row in the range or list of resource IDs of the preceding row. This may also include incrementing 602 a count (if any) of the preceding row so that the preceding row accounts for the addition of the current row. Once the current row is combined with the preceding row, the current row may be deleted 604 from the list 202.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method for presenting output returned by a command-line interface, the method comprising:
providing a command-line interface (CLI) to receive commands entered by a user in the form of successive lines of text and execute the commands to provide a textual display of results;
submitting, by way of the CLI, a command to a processor to retrieve a list of resources and visually present the list on a display device coupled to the processor, each resource comprising a resource name and a set of attributes displayed in columns, each attribute having an attribute value;
submitting, in association with the command, a compress indicator to the processor to visually compress the list on the display device;
retrieving, by the processor, the list of resources; and
visually compressing, by the processor, the list such that resources with identical attributes and attribute values are grouped together and visually presented on the display device as a single tuple in the list, wherein at least one of a range of resource names and a list of resource names is entirely contained within the single tuple.

2. The method of claim 1, wherein the tuple identifies the resources with identical attributes and attribute values in a column of the tuple.

3. The method of claim 1, wherein the list of resource names is a comma delimited list of resource names.

4. The method of claim 1, wherein the tuple identifies how many resources with identical attributes are represented by the tuple.

5. The method of claim 1, wherein the resources with identical attributes and attribute values include contiguous resources.

6. The method of claim 1, wherein the resources with identical attributes and attribute values include non-contiguous resources.

7. The method of claim 1, wherein the identical attributes are a user-selected set of identical attributes.

8. A computer program product for presenting output returned by a command-line interface, the computer program product comprising a non-transitory computer readable storage medium having computer-usable program code embodied therein, the computer-usable program code comprising:

computer-usable program code to provide a command-line interface (CLI) to receive commands entered by a user in the form of successive lines of text and execute the commands to provide a textual display of results;

computer-usable program code to submit, by way of the CLI, a command to a processor to retrieve a list of resources and visually present the list on a display device coupled to the processor, each resource comprising a resource name and a set of attributes displayed in columns, each attribute having an attribute value;

computer-usable program code to submit, in association with the command, a compress indicator to the processor to visually compress the list on the display device;

computer-usable program code to cause the processor to retrieve the list of resources; and computer-usable program code to cause the processor to visually compress the list such that resources with identical attributes and attribute values are grouped together and visually presented on the display device as a single tuple in the list, wherein at least one of a range of resource names and a list of resource names is entirely contained within the single tuple.

9. The computer program product of claim 8, wherein the tuple identifies the resources with identical attributes and attribute values in a column of the tuple.

10. The computer program product of claim 8, wherein the list of resource names is a comma delimited list of resource names.

11. The computer program product of claim 8, wherein the tuple identifies how many resources with identical attributes are represented by the tuple.

12. The computer program product of claim 8, wherein the resources with identical attributes and attribute values include contiguous resources.

13. The computer program product of claim 8, wherein the resources with identical attributes and attribute values include non-contiguous resources.

14. The computer program product of claim 8, wherein the identical attributes are a user-selected set of identical attributes.

15. A system for presenting output returned by a command-line interface, the system comprising:

at least one processor;

at least one memory device coupled to the at least one processor and storing instructions for execution on the at least one processor, the instructions causing the at least one processor to:

provide a command-line interface (CLI) to receive commands entered by a user in the form of successive lines of text and execute the commands to provide a textual display of results;

submit, by way of the CLI, a command to retrieve a list of resources and visually present the list on a display device, each resource comprising a resource name and a set of attributes displayed in columns, each attribute having an attribute value;

submit, in association with the command, a compress indicator to visually compress the list on the display device;

retrieve the list of resources; and visually compress the list such that resources with identical attributes and attribute values are grouped together and visually presented on the display device as a single tuple in the list, wherein at least one of a range of resource names and a list of resource names is entirely contained within the single tuple.

16. The system of claim 15, wherein the list of resource names is a comma delimited list of resource names.

17. The system of claim 15, wherein the tuple identifies how many resources with identical attributes are represented by the tuple.

18. The system of claim 15, wherein the identical attributes are a user-selected set of identical attributes.

\* \* \* \* \*